(12) United States Patent  
Park et al.

(10) Patent No.: US 8,580,629 B2
(45) Date of Patent: Nov. 12, 2013

(54) METHOD OF FABRICATING SEMICONDUCTOR DEVICE USING A WORK FUNCTION CONTROL FILM

(75) Inventors: Hong-Bae Park, Incheon (KR); Sang-Jin Hyun, Suwon-si (KR); Hu-Yong Lee, Seoul (KR); Hoon-Joo Na, Hwaseong-si (KR); Jeong-Hee Han, Hwaseong-si (KR); Hye-Lan Lee, Hwaseong-si (KR); Hyung-Seok Hong, Ansan-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 41 days.

(21) Appl. No.: 13/241,871

(22) Filed: Sep. 23, 2011

(65) Prior Publication Data

US 2012/0122309 A1    May 17, 2012

(30) Foreign Application Priority Data

Nov. 15, 2010    (KR) .................. 10-2010-0113350

(51) Int. Cl.
*H01L 21/8238* (2006.01)
(52) U.S. Cl.
USPC ..... 438/199; 438/216; 438/275; 257/E21.637
(58) Field of Classification Search
USPC .......... 438/199, 216, 275, 287; 257/E21.637
See application file for complete search history.

(56) References Cited

U.S. PATENT DOCUMENTS 7,381,619 B2 *    6/2008    Wang et al. .................. 438/275

FOREIGN PATENT DOCUMENTS

| JP | 2002-299610 | 10/2002 |
| JP | 2009-33032 | 2/2009 |
| KR | 10-0403906 | 10/2003 |

* cited by examiner

*Primary Examiner* — Thanhha Pham
(74) *Attorney, Agent, or Firm* — Stanzione & Kim, LLP

(57) ABSTRACT

A method of fabricating a semiconductor device may include: preparing a substrate in which first and second regions are defined; forming an interlayer insulating film, which includes first and second trenches, on the substrate; forming a work function control film, which contains Al and N, along a top surface of the interlayer insulating film, side and bottom surfaces of the first trench, and side and bottom surfaces of the second trench; forming a mask pattern on the work function control film formed in the second region; injecting a work function control material into the work function control film formed in the first region to control a work function of the work function control film formed in the first region; removing the mask pattern; and forming a first metal gate electrode to fill the first trench and forming a second metal gate electrode to fill the second trench.

15 Claims, 13 Drawing Sheets

METHOD OF FABRICATING SEMICONDUCTOR DEVICE USING A WORK FUNCTION CONTROL FILM

CROSS-REFERENCE TO RELATED APPLICATIONS

This application claims priority from Korean Patent Application No. 10-2010-0113350 filed on Nov. 15, 2010 in the Korean Intellectual Property Office, the disclosure of which is incorporated herein by reference in its entirety.

BACKGROUND OF THE INVENTION

1. Field of the Invention

The present inventive concept relates to a method of fabricating a semiconductor device, and more particularly, to a method of fabricating a complementary metal oxide semiconductor (CMOS).

2. Description of the Related Art

Recently, metal gates have been frequently used instead of polysilicon gates to improve device characteristics. Metal gates can be fabricated using a replacement metal gate process. Meanwhile, a complementary metal oxide semiconductor (CMOS) should be fabricated such that a p-channel metal oxide semiconductor (PMOS) and an n-channel metal oxide semiconductor (NMOS) have different work functions. To this end, however, a plurality of films need to be deposited in a trench during the replacement metal gate process.

SUMMARY OF THE INVENTION

Exemplary embodiments of the present inventive concept provide a method of fabricating a semiconductor device, in which a p-channel metal oxide semiconductor (PMOS) and an n-channel metal oxide semiconductor (NMOS) are made to have different work functions using a single work function control film.

Additional features and utilities of the present general inventive concept will be set forth in part in the description which follows and, in part, will be obvious from the description, or may be learned by practice of the general inventive concept.

Exemplary embodiments of the inventive concept provide a method of fabricating a semiconductor device. The method includes: preparing a substrate in which first and second regions are defined; forming an interlayer insulating film, which includes first and second trenches, on the substrate; forming a work function control film, which contains Al, along a top surface of the interlayer insulating film, side and bottom surfaces of the first trench, and side and bottom surfaces of the second trench; forming a mask pattern on the work function control film formed in the second region; injecting a work function control material into the work function control film formed in the first region; removing the mask pattern; and forming a first metal gate electrode to fill the first trench and forming a second metal gate electrode to fill the second trench, wherein the first and second trenches are formed in the first and second regions, respectively.

Exemplary embodiments of the present inventive concept also provide a method of fabricating a semiconductor device. The method includes: preparing a substrate in which first and second regions are defined; forming an interlayer insulating film, which includes first and second trenches, on the substrate; forming a work function control film, which contains Al and N, along a top surface of the interlayer insulating film, side and bottom surfaces of the first trench, and side and bottom surfaces of the second trench; forming a mask pattern on the work function control film formed in the second region; injecting a work function control material into the work function control film formed in the first region to control a work function of the work function control film formed in the first region; removing the mask pattern; and forming a first metal gate electrode to fill the first trench and forming a second metal gate electrode to fill the second trench, wherein the first and second trenches are formed in the first and second regions, respectively.

Exemplary embodiments of the present inventive concept also provide a method of fabricating a semiconductor device, the method including forming a trench in each of a first region and a second region of an interlayer insulating film, depositing a gate insulating film across and interlayer insulating film including the trenches, depositing a work function control film on the gate insulating film, depositing a removable film over one of the first and second regions on the work function control film, injecting a work function control material into the other one of the first and second regions on the work function control film at which the removable material is not deposited such that the work function of the work function control film at the one region is unchanged while the work function of the work function control film in the other region is changed, removing the removable film, and forming a first metal gate electrode to fill the trench in the first region and a second metal gate electrode to fill the trench in the second region.

In an embodiment, the work function of the work function control film in the other region is increased.

In an embodiment, the work function control film is an NMOS-type work function control film, and the work function control material injected into the other one of the first and second regions is an N-containing work function control material such that a PMOS-type work function control film is formed.

In an embodiment, the work function control material is injected into the work function control film by an annealing process.

In an embodiment, the work function of the work function control film in the other region is decreased.

In an embodiment, the work function control film is a PMOS-type work function control film, and the work function control material injected into the other one of the first and second regions is a material which forms an NMOS-type work function control film.

In an embodiment, the depositing a removable film over one of the first and second regions on the work function control film includes depositing a removable film conformally over the work function control film, forming a photoresist pattern on the removable film at one of the first and second regions, and removing the removable film from the other one of the first and second regions in which the photoresist pattern is not formed using the photoresist pattern as a mask.

In an embodiment, the operation of removing the removable film comprises removing the photoresist pattern and the remaining removable film thereunder.

In an embodiment, the interlayer insulating layer is formed on a substrate and a pre-gate insulating film is formed on bottom surfaces of the trenches between the substrate and the gate insulating film.

In an embodiment, the removable film is one of an oxide film, a nitride film, a metal film or a photoresist film.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
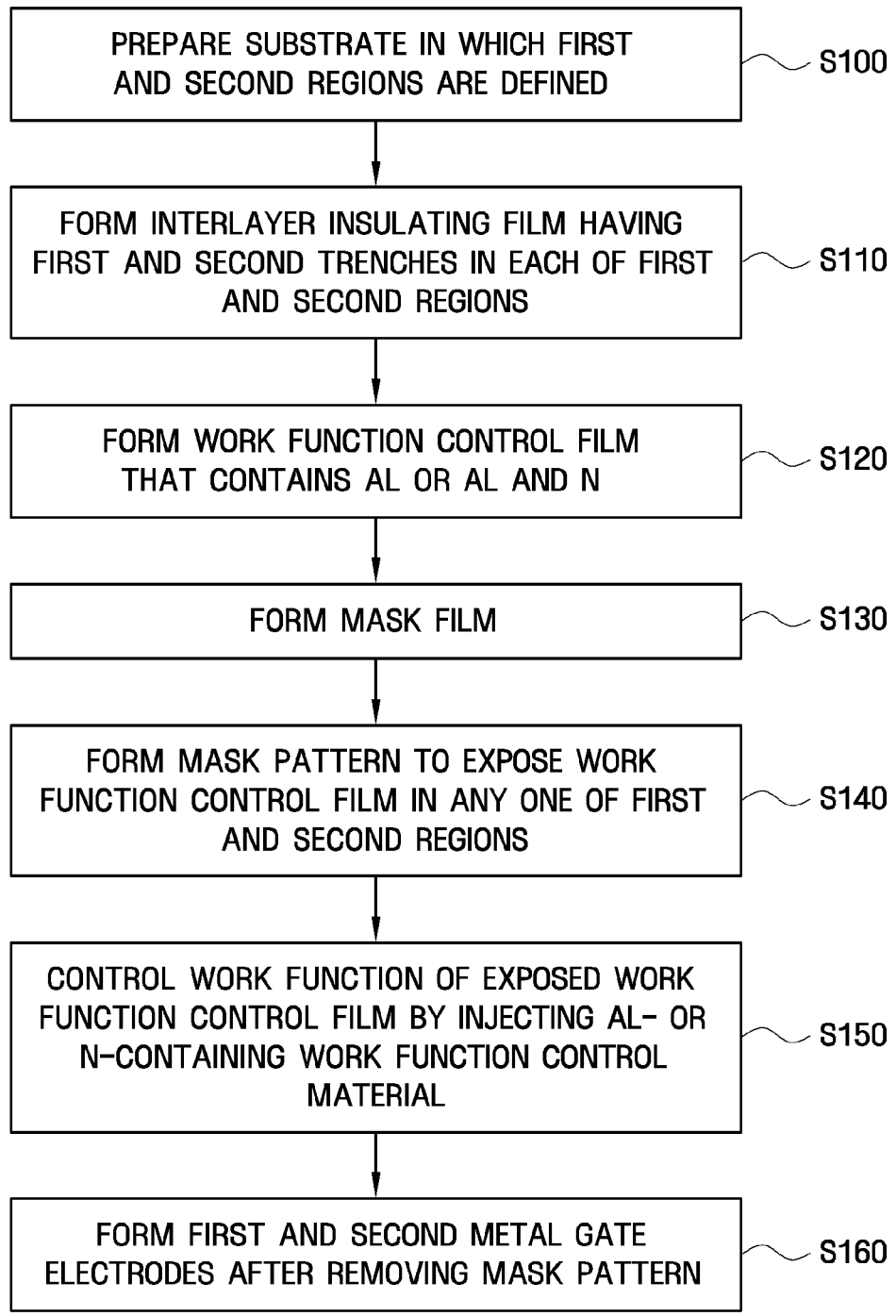
FIG. 1 is a flowchart illustrating a method of fabricating a semiconductor device using metal aluminum nitride according to an exemplary embodiment of the present inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

It will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a flowchart illustrating a method of fabricating a semiconductor device using metal aluminum nitride according to an exemplary embodiment of the present inventive concept. For ease of description, FIG. 1 will be described together with FIGS. 2 through 13.

FIGS. 2 through 9 are views illustrating the method of fabricating a semiconductor device using metal aluminum nitride according to the exemplary embodiment of the present inventive concept. In FIGS. 2 through 9, a source/drain region and a device isolation region (such as a shallow trench isolation (STI) region) formed in a substrate 2 are not illustrated for simplicity.

Figure 2:
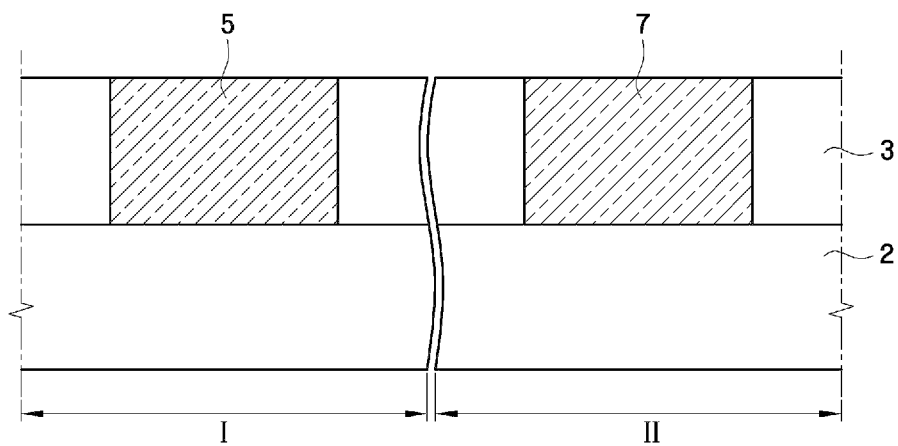
FIGS. 2 through 9 are cross-sectional views of intermediate structures to explain the method of fabricating a semiconductor device using metal aluminum nitride according to the exemplary embodiment of the present inventive concept.

Referring to FIG. 2 and operation S100, a first region I and a second region II are defined in the substrate 2. The first region I may be an n-channel metal oxide semiconductor (NMOS) region, and the second region II may be a p-channel metal oxide semiconductor (PMOS) region.

The substrate 2 may be a bulk silicon substrate or a silicon-on-insulator (SOI) substrate. Otherwise, the substrate 2 may be a silicon substrate or a substrate made of another material such as germanium, indium antimonide, lead telluride, indium arsenide, indium phosphide, gallium arsenide, or gallium antimonide. However, the material that forms the substrate 2 is not limited to the above materials.

A first sacrificial gate 5 is formed on the substrate 2 in the first region I, and a second sacrificial gate 7 is formed on the substrate 2 in the second region II.

Each of the first sacrificial gate 5 and the second sacrificial gate 7 may be a semiconductor material such as polysilicon. In addition, both of the first sacrificial gate 5 and the second sacrificial gate 7 may not be doped at all or may be doped with similar materials. Otherwise, one of the first sacrificial gate 5 and the second sacrificial gate 7 may be doped while the other one is not doped. Otherwise, one of the first sacrificial gate 5 and the second sacrificial gate 7 may be doped with an n-type material (such as arsenic, phosphorous, or other n-type materials), and the other one may be doped with a p-type material (such as boron or other p-type materials).

Although not shown in the drawings, a pre-gate insulating film (not shown) may be disposed between the first and second sacrificial gates 5 and 7 and the substrate 2. The pre-gate insulating film (not shown) may be, for example, an oxide film or a nitride film.

Next, an interlayer insulating film 3 is formed on the substrate 2 to cover the first sacrificial gate 5 and the second sacrificial gate 7. The interlayer insulating film 3 may contain silicon dioxide or a low-k material. The interlayer insulating film 3 may be doped with phosphorous, boron, or other elements and may be formed by a high-density plasma deposition process.

The interlayer insulating film 3 is planarized to expose top surfaces of the first and second sacrificial gates 5 and 7. Here, a chemical mechanical polishing (CMP) process, for example, may be used.

Figure 3:
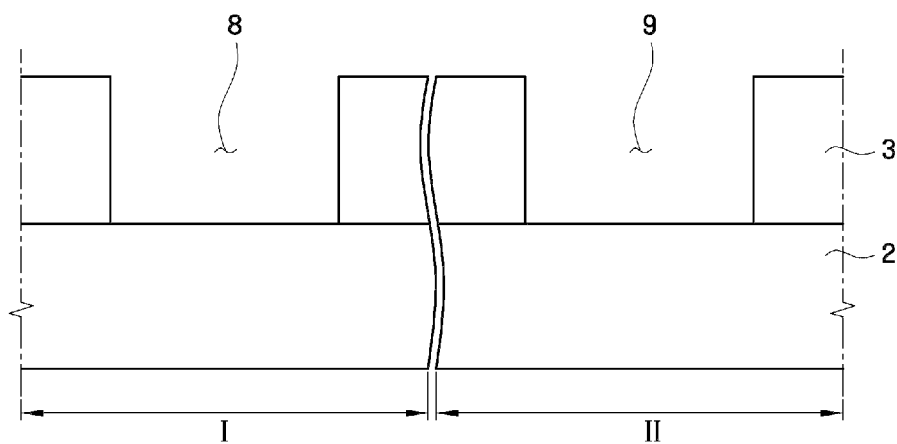

Referring to FIG. 3 and operation S110, the first and second sacrificial gates 5 and 7 are removed to form first and second trenches 8 and 9, respectively.

The first and second sacrificial gates 5 and 7 may be removed by, for example, a wet-etching process or a dry-etching process. In the wet-etching process, in particular, the first and second sacrificial gates 5 and 7 may be exposed to an aqueous solution, which contains a hydroxide source, at a sufficiently high temperature for a sufficient period of time and thus be removed substantially. The hydroxide source may contain, but is not limited to, ammonium hydroxide or tetraalkylammonium hydroxide such as tetramethylammonium hydroxide (TMAH).

The removal of the first and second sacrificial gates 5 and 7 may result in the exposure of the pre-gate insulating film (not shown). In some cases, all of the first and second sacrificial gates 5 and 7 and the pre-gate insulating film (not shown) may be removed, thereby exposing a top surface of the substrate 2. When the top surface of the substrate 2 is exposed, an additional pre-gate insulating film (not shown) may be formed to a thickness of 6 to 7 Å on a bottom surface of each of the first and second trenches 8 and 9 before the formation of first and second high-k gate insulating films 101 and 201 (see FIG. 4) in a subsequent process. This is because properties of the first and second gate insulating films 101 and 201 may deteriorate if the first and second gate insulating films 101 and 201 contact the substrate 2.

Figure 4:
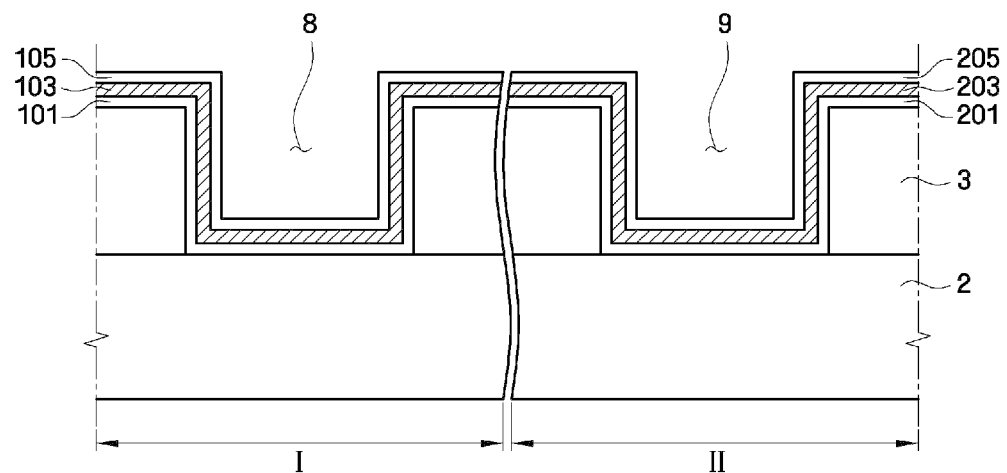

Referring to FIG. 4 and operations S120 and S130, the first and second gate insulating films 101 and 201 are formed along a top surface of the interlayer insulating film 3, side and bottom surfaces of the first trench 8, and side and bottom surfaces of the second trench 9. Then, first and second NMOS-type work function control films 103 and 203 and first and second mask films 105 and 205 are sequentially and conformally formed on the first and second gate insulating films 101 and 201, respectively.

Each of the first gate insulating film 101 and the second gate insulating film 201 may contain a silicon oxide film or a high-k material. That is, each of the first and second gate insulating films 101 and 201 may be a single silicon oxide film, a single film of a high-k material, or a stack of the silicon oxide film and the high-k material.

The high-k material may include, but is not limited to, at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The first NMOS-type work function control film 103 and the second NMOS-type work function control film 203 may contain Al and may be, for example, metal aluminum ($M_xAl_y$, where x+y=1 (0<x and y<1)) or metal aluminum nitride ($M_xAl_yN_z$, where x+y+z=1 (0<x, y and z<1)). The first and second NMOS-type work function control films 103 and 203 may be defined as work function control films having a work function of, for example, 4.5 eV or less, and first and second PMOS-type work function control films 113 and 213 (see FIG. 10) may be defined as work function control films having a work function of, for example, 4.5 eV or more.

The first NMOS-type work function control film 103 and the second NMOS-type work function control film 203 may contain, but is not limited to, any one metal selected from Ti, Ta, Mo, W, and Hf. For example, the first NMOS-type work function control film 103 may be made of $Ti_xAl_yN_z$, wherein x+y+z=1 (0<x and y, z<1) or $Ti_xAl_y$, where x+y=1 (0<x, y<1). For ease of description, $Ti_xAl_yN_z$ or $Ti_xAl_y$ will be described in the present specification as an example.

A complementary metal oxide semiconductor (CMOS) can be formed using a dual work function in which a gate in an NMOS region has a relatively low work function value while a gate in a PMOS region has a relatively high work function value.

The work function of metal aluminum nitride may vary according to the composition ratio of Al or N. For example, when Al is injected into the metal aluminum nitride, the composition ratio of Al may increase, thereby reducing the work function of the metal aluminum nitride. On the other hand, when N is injected into the metal aluminum nitride, the composition ratio of N may increase, thereby increasing the work function of the metal aluminum nitride.

Each of the first mask film 105 and the second mask film 205 may be an oxide film, a nitride film, or a metal film. Alternatively, each of the first and second mask films 105 and 205 may be a photoresist film. However, the material that forms each of the first and second mask films 105 and 205 is not limited to the above materials, and any material that can be easily removed can be used.

As shown in FIG. 4, the first and second mask films 105 and 205 are conformally formed on the first and second NMOS-type work function control films 103 and 203, respectively. Alternatively, the first and second mask films 105 and 205 may be formed to fill the first and second trenches 8 and 9, respectively.

Figure 5:
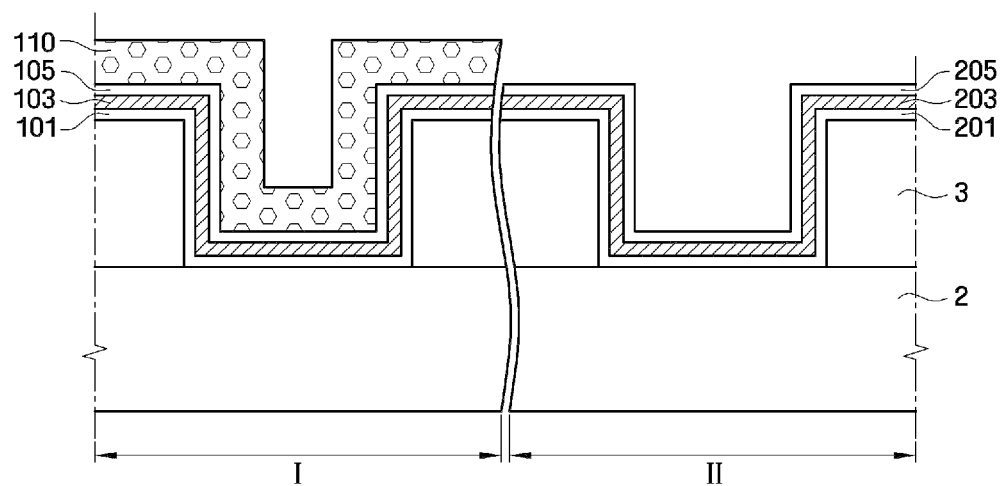

Referring to FIG. 5, a photoresist film (not shown) is formed on the substrate 2 and then developed to form a photoresist pattern 110 in the first region I.

Figure 6:
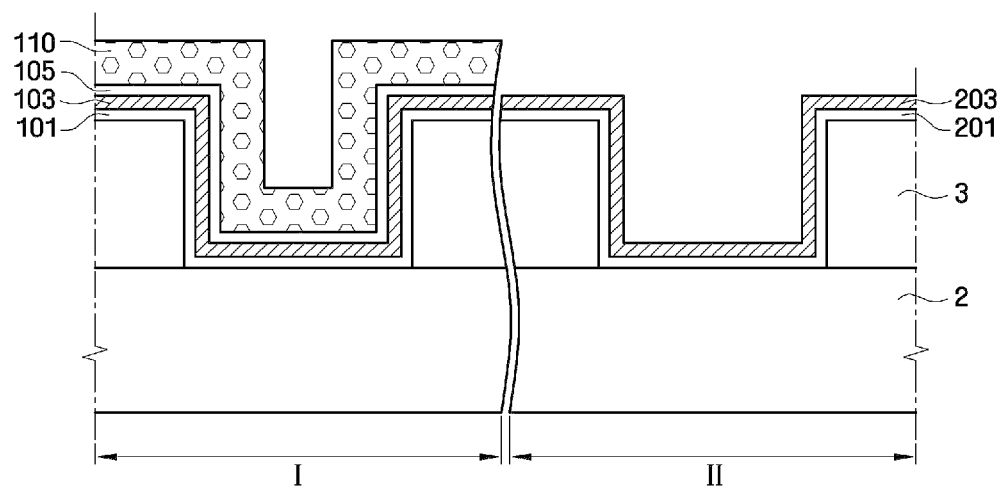

If each of the first and second mask films 105 and 205 is formed of a photoresist material having a sufficient thickness, a process of FIG. 6 may be performed without forming the first photoresist pattern 110 as shown in FIG. 5.

Referring to FIG. 6 and operation S140, the second mask film 205 in the second region II is removed using the first photoresist pattern 110. Consequently, only the first mask film 105 in the first region I remains.

When the second mask film 205 formed in the second region II is removed, the second NMOS-type work function control film 203 of the second region II is exposed.

Here, the second mask film 205 may be removed using a wet-etching process in order to reduce the damage to the second NMOS-type work function control film 203 which is exposed by the removal of the second mask film 205. Alternatively, if the second mask film 205 is made of a photoresist material, it may be developed and thus be removed.

Figure 7:
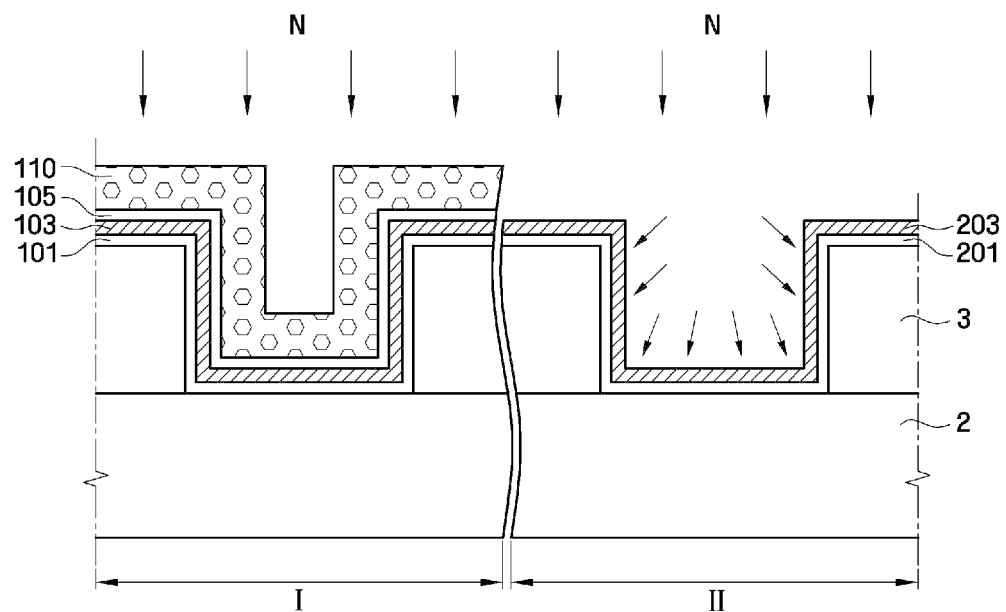
Figure 8:
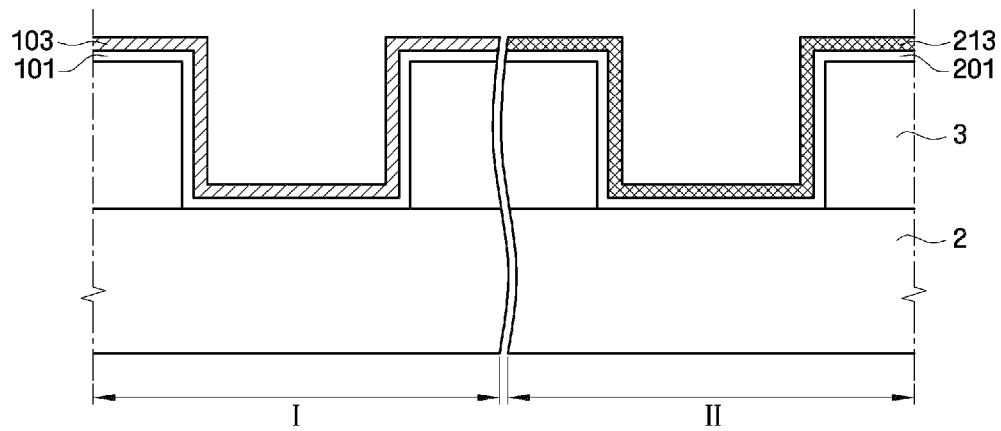

Referring to FIGS. 7 and 8 and operation S150, a work function control material is injected into the second NMOS-type work function control film 203, thereby forming a second PMOS-type work function control film 213. The work function control material may contain, for example, N.

To inject the N-containing work function control material into the second NMOS-type work function control film 203, an annealing process may be performed in an $N_2$ or $NH_3$ atmosphere, or a plasma process may be performed in an in an $N_2$ or $NH_3$ atmosphere. Alternatively, an ion implantation method may be used to inject N. Using one of the above methods, the second NMOS-type work function control film 203 may be injected with nitride. Additionally, the second NMOS-type work function control film 203 (injected with nitride) may be annealed at approximately 400° C. to ensure the stability of the nitride injected second NMOS-type work function control film 203.

The injection of N into the second NMOS-type work function control film 203 increases the N composition ratio of the second NMOS-type work function control film 203, thus forming predominantly metal-N bonds, that is, bonds between metal and N. For example, when the second NMOS-type work function control film 203 is $Ti_xAl_yN_z$ or $Ti_xAl_y$, the Ti in $Ti_xAl_yN_z$ or $Ti_xAl_y$ reacts with injected N to form Ti—N bonds. Accordingly, the proportion of Ti—N bonds in the second NMOS-type work function control film 203 increases. Al in $Ti_xAl_yN_z$ or $Ti_xAl_y$ may also react with injected N to form Al—N bonds. However, since Ti—N bonds are more stable than Al—N bonds, they may be formed more predominantly than Al—N bonds. That is, the injection of N into the second NMOS-type work function control film 203 increases the N composition ratio, thus increasing the proportion of Ti—N bonds in the second NMOS-type work function control film 203. As the second NMOS-type work function control film 203 becomes richer in Ti—N bonds, its work function increases. As a result, the second PMOS-type work function control film 213 is formed in the second region II.

Since the first mask film 105 and the first photoresist pattern 110 are formed on the first NMOS-type work function control film 103 of the first region I, N is not injected into the first NMOS-type work function control film 103. Therefore, the work function of the first NMOS-type work function control film 103 remains unchanged, while the work function of the second NMOS-type work function control film 203 increases to turn the second NMOS-type work function control film 203 into the second PMOS-type work function control film 213. Consequently, the work function of a gate formed in the second region II becomes different from that of a gate formed in the first region I.

A CMOS typically consists of a PMOS and an NMOS having different work functions. In the exemplary embodiment of the present inventive concept, a PMOS and an NMOS can be made to have different work functions by controlling the composition ratio of a single film. Since only one film is used, a space for a subsequent process can be advantageously secured in each of the first and second trenches 8 and 9.

For example, since the number of films stacked inside each of the first and second trenches 8 and 9 can be reduced, a wide aperture region can be obtained, and a space for depositing a metal film to form first and second metal gate electrodes 120 and 220 (see FIG. 9) can be secured.

Next, the first mask film 105 and the first photoresist pattern 110 are removed. For example, when the first mask film 105 is made of photoresist, the first mask film 105 and the first photoresist pattern 110 may be simultaneously removed using a non-O2 ashing process or a development process. When the non-O2 ashing process is used, the damage to the exposed second PMOS-type work function control film 213 can be reduced.

Figure 9:
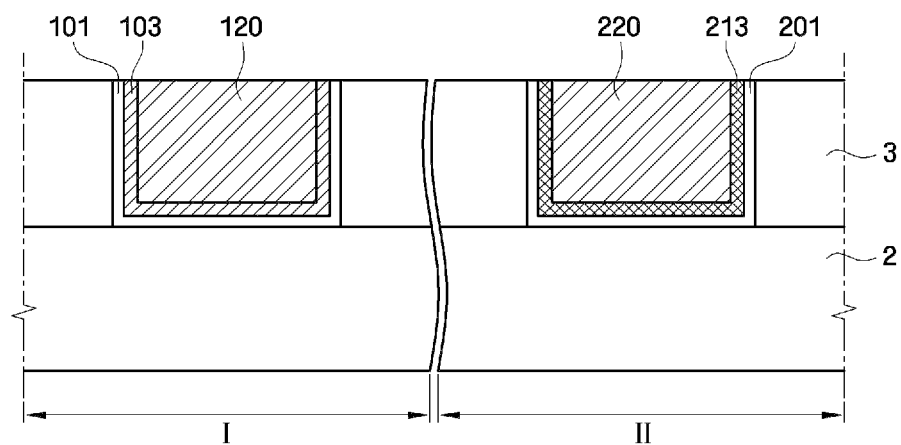

Referring to FIG. 9 and operation S160 of FIG. 1, the first metal gate electrode 120 is formed to fill the first trench 8, and the second metal gate electrode 220 is formed to fill the second trench 9.

Specifically, a metal film (not shown) may be formed to fully fill each of the first trench 8 and the second trench 9. When a single work function control film is used according to the exemplary embodiment of the present inventive concept, the number of films stacked inside each of the first and second trenches 8 and 9 can be minimized, thereby securing a wide aperture region. When the metal film (not shown) is formed, the wide aperture region can prevent aperture clogging caused by an overhang thereof. In addition, the metal film (not shown) can be formed easily without a void inside each of the first and second trenches 8 and 9. Furthermore, a top surface of each of the wide first and second metal gate electrodes 120 and 220 can reduce the resistance of a gate.

Next, the metal film is planarized to expose the top surface of the interlayer insulating film 3, thereby forming the first metal gate electrode 120 and the second metal gate electrode 220.

The first metal gate electrode 120 and the second metal gate electrode 220 may contain at least one of aluminum, tungsten, and copper.

The first and second work function control films 103 and 213 made of, e.g., $Ti_xAl_yN_z$ exhibit superior barrier characteristics. Thus, even when they contact the first and second metal gate electrodes 120 and 220, their work functions change little.

In summary, in the first region I, the first gate insulating film 101 and the first NMOS-type work function control film 103 are formed on the side and bottom surfaces of the first trench 8, and the first metal gate electrode 120 is formed to fill the first trench 8.

On the other hand, in the second region II, the second gate insulating film 201 and the second PMOS-type work function control film 213 are formed on the side and bottom surfaces of the second trench 9, and the second metal gate electrode 220 is formed to fill the second trench 9.

Since different work function control films are formed in the first and second regions I and II, the work function of a gate formed in the first region is different from that of a gate formed in the second region II. This enables the fabrication of a CMOS.

Hereinafter, a method of fabricating a semiconductor device using metal aluminum nitride according to another exemplary embodiment of the present inventive concept will be described with reference to FIGS. 2, 3, and 9 through 13. For simplicity, the following description will focus on the differences between the fabrication method according to the current exemplary embodiment and the fabrication method according to the previous exemplary embodiment.

Referring to FIGS. 2, 3, and operations S100 and S110 of FIG. 1, as described above, first and second sacrificial gates 5 and 7 formed on a substrate 2 in which a first region I and a second region II are defined are removed, thereby forming an interlayer insulating film 3 having first and second trenches 8 and 9.

Figure 10:
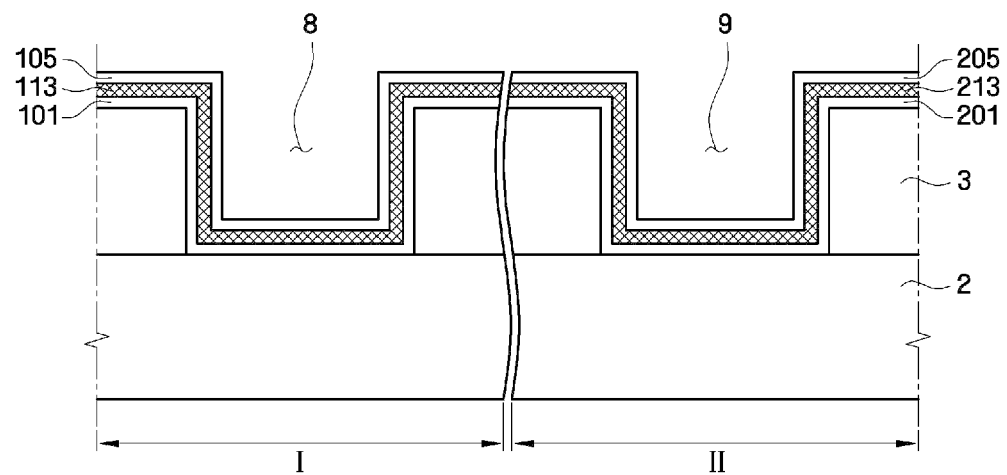
FIGS. 10 through 13 are cross-sectional views of intermediate structures to explain a method of fabricating a semiconductor device using metal aluminum nitride according to another exemplary embodiment of the present inventive concept.

Referring to FIG. 10 and operations S120 and S130 of FIG. 1, first and second gate insulating films 101 and 201 are formed along a top surface of the interlayer insulating film 3, side and bottom surfaces of the first trench 8, and side and bottom surfaces of a second trench 9. Then, first and second PMOS-type work function control films 113 and 213 and first and second mask films 105 and 205 are conformally formed on the first and second gate insulating films 101 and 201, respectively.

Each of the first and second PMOS-type work function control films 113 and 213 may be metal aluminum nitride ($M_xAl_y$, where x+y=1 (0<x and y<1)) that contains Al and N.

Figure 11:
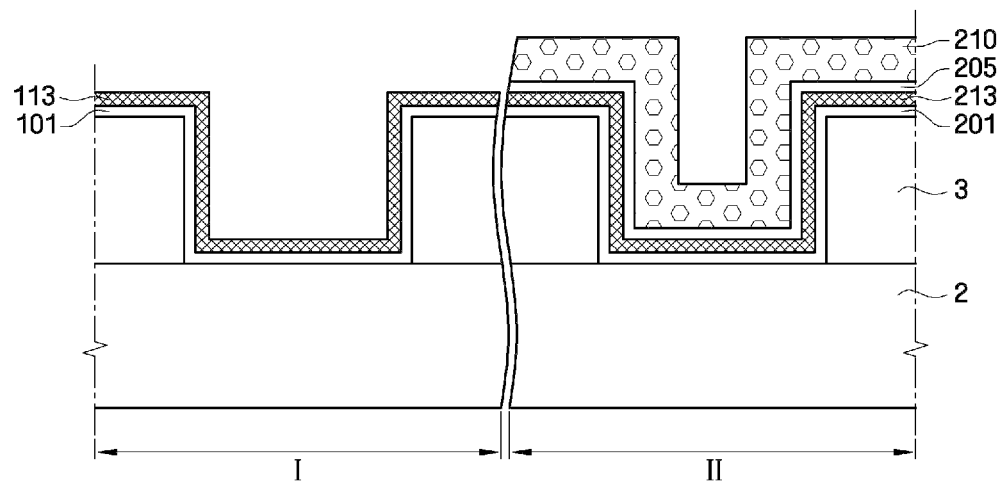

Referring to FIG. 11 and operation S140 of FIG. 1, a photoresist film (not shown) is formed on the substrate 2 and then developed to form a second photoresist pattern 210 in the second region II. When the first mask film 105 formed in the first region I is removed using the second photoresist pattern 210, only the second mask film 205 in the second region II remains. The removal of the first mask film 105 from the first region I results in the exposure of the first PMOS-type work function control film 113 in the first region I.

Figure 12:
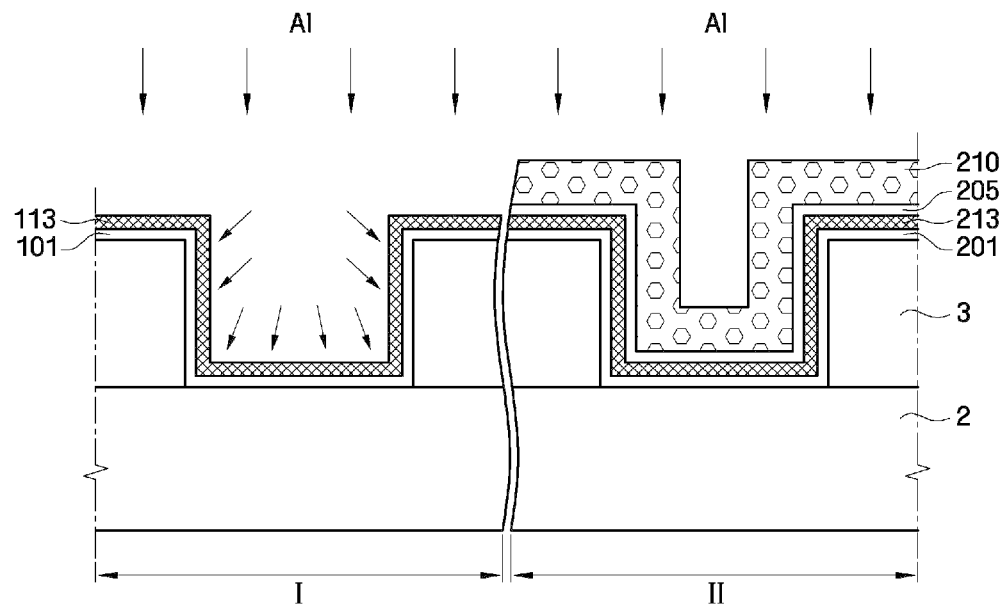
Figure 13:
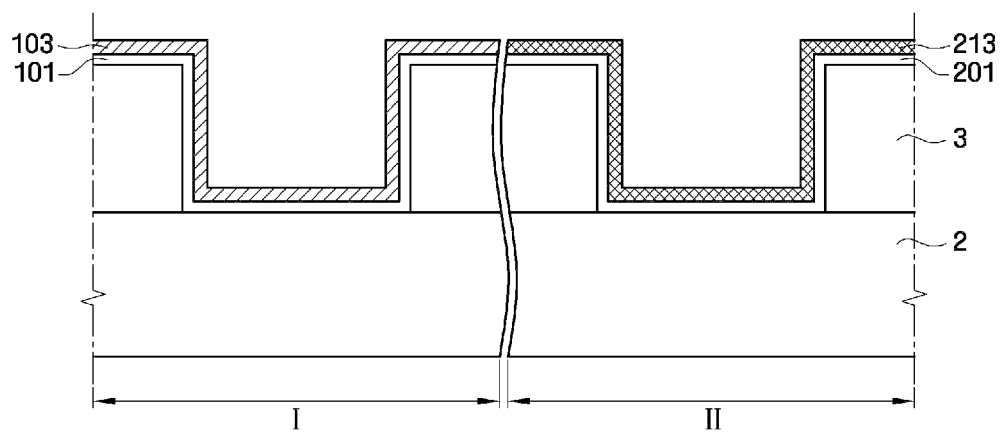

Referring to FIGS. 12 and 13 and operation S150 of FIG. 1, a work function control material is injected into the first PMOS-type work function control film 113, thereby forming a first NMOS-type work function control film 103. The work function control material may contain, for example, Al. Then, the second mask film 205 and the second photoresist pattern 210 are removed.

The Al-containing work function control material may be injected into the first PMOS-type work function control film 113 using ion implantation. Accordingly, Al may be injected into the first PMOS-type work function control film 113. Alternatively, Al may be injected into the first PMOS-type work function control film 113 by forming an Al thin film on the first PMOS-type work function control film 113 and heating the Al thin film so that Al diffuses to the first PMOS-type work function control film 113. After the injection of Al, the first PMOS-type work function control film 113 may be annealed at approximately 400° C. in order to ensure the stability of the first PMOS-type work function control film 113.

The injection of Al into the first PMOS-type work function control film 113 increases the Al composition ratio of the first PMOS-type work function control film 113. Since Al has a relatively low work function, an increase in the Al composition ratio may lead to a reduction in the work function of the first PMOS-type work function control film 113. That is, as the first PMOS-type work function control film 113 becomes richer in Al, its work function decreases. As a result, the first NMOS-type work function control film 103 is formed in the first region I.

Since the second mask film 205 and the second photoresist pattern 210 are formed on the second PMOS-type work function control film 213 of the second region II, Al is not injected into the second PMOS-type work function control film 213. Therefore, the work function of the second PMOS-type work function control film 213 remains unchanged, while the work function of the first PMOS-type work function control film 113 decreases to turn the first PMOS-type work function control film 113 into the first NMOS-type work function control film 103. Consequently, the work function of a gate formed in the first region I becomes different from that of a gate formed in the second region II.

Referring to FIG. 9 and operation S160 of FIG. 1, a first metal gate electrode 120 is formed to fill the first trench 8, and a second metal gate electrode 220 is formed to fill the second trench 9.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of fabricating a semiconductor device, the method comprising:
    preparing a substrate in which first and second regions are defined;
    forming an interlayer insulating film, which comprises first and second trenches, on the substrate;
    forming a work function control film, which contains Al, along a top surface of the interlayer insulating film, side and bottom surfaces of the first trench, and side and bottom surfaces of the second trench;
    forming a mask pattern on the work function control film formed in the second region;
    injecting a work function control material into the work function control film formed in the first region;
    removing the mask pattern; and
    forming a first metal gate electrode to fill the first trench and forming a second metal gate electrode to fill the second trench,
    wherein the first and second trenches are formed in the first and second regions, respectively.

2. The method of claim 1, wherein the work function control film before the injecting of the work function control material further contains N.

3. The method of claim 2, wherein the work function control material contains Al.

4. The method of claim 3, wherein the Al-containing work function control material is injected using an ion implantation method or a method in which an Al thin film is stacked and then diffused.

5. The method of claim 3, wherein the work function control material is injected into the work function control film formed in the first region to increase an Al composition ratio of the work function control film formed in the first region and decrease a work function of the work function control film formed in the first region.

6. The method of claim 3, wherein the first region is an n-channel metal oxide semiconductor (NMOS) region, and the second region is a p-channel metal oxide semiconductor (PMOS) region.

7. The method of claim 2, wherein the work function control material contains N.

8. The method of claim 7, wherein the N-containing work function control material is injected using any one of an annealing method in an $NH_3$-containing gas atmosphere, a plasma method in an $N_2$- or $NH_3$-containing gas atmosphere, and an ion implantation method.

9. The method of claim 7, wherein the work function control material is injected into the work function control film formed in the first region to increase an N composition ratio and work function of the work function control film formed in the first region.

10. The method of claim 7, wherein the first region is the PMOS region, and the second region is the NMOS region.

11. The method of claim 1, wherein the work function control material contains N.

12. The method of claim 11, wherein the N-containing work function control material is injected using any one of an annealing method in an $NH_3$-containing gas atmosphere, a plasma method in an $N_2$- or $NH_3$-containing gas atmosphere, and an ion implantation method.

13. The method of claim 11, wherein the work function control material is injected into the work function control film formed in the first region to increase the N composition ratio and work function of the work function control film formed in the first region.

14. The method of claim 11, wherein the first region is the PMOS region, and the second region is the NMOS region.

15. The method of claim 1, wherein the work function control material is injected into the work function control film such that the work function of the work function control film formed in the first region becomes different from that of the work function control film formed in the second region.

* * * * *